United States Patent
Chen et al.

(10) Patent No.: US 8,977,991 B2
(45) Date of Patent: Mar. 10, 2015

(54) METHOD AND SYSTEM FOR REPLACING A PATTERN IN A LAYOUT

(71) Applicant: Taiwan Semiconductor Manufacturing Co., Ltd., Hsin-Chu (TW)

(72) Inventors: Huang-Yu Chen, Zhudong Township (TW); Yuan-Te Hou, Hsinchu (TW); Chung-Min Fu, Chungli (TW); Chung-Hsing Wang, Baoshan Township (TW); Wen-Hao Chen, Hsin-Chu (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/068,006

(22) Filed: Oct. 31, 2013

(65) Prior Publication Data
US 2014/0059504 A1 Feb. 27, 2014

Related U.S. Application Data

(62) Division of application No. 13/269,757, filed on Oct. 10, 2011, now Pat. No. 8,601,408.

(51) Int. Cl.
*G06F 17/50* (2006.01)

(52) U.S. Cl.
CPC .................. *G06F 17/5077* (2013.01)
USPC .................. 716/55; 716/50; 716/51; 716/52; 716/53; 716/54; 716/126; 716/136; 716/139

(58) Field of Classification Search
CPC ............ G06F 17/5081; G06F 17/5077; H01L 27/0207; G03F 1/00
USPC .............................. 716/50–55, 126, 136, 139
See application file for complete search history.

(56) References Cited

U.S. PATENT DOCUMENTS

| 7,531,449 B2 | 5/2009 | Park et al. |
| 7,879,727 B2 | 2/2011 | Postnikov et al. |

(Continued)

OTHER PUBLICATIONS

Cho, M. et al, "Double Patterning Technology Friendly Detailed Routing", IEEE/ACM International Conference on Computer-Aided Design, pp. 506-511, Nov. 2008.

(Continued)

*Primary Examiner* — Helen Rossoshek
(74) *Attorney, Agent, or Firm* — Duane Morris LLP; Steven E. Koffs

(57) ABSTRACT

A received layout identifies a plurality of circuit components to be included in an integrated circuit (IC) layer for double patterning the layer using two photomasks, the layout including a plurality of first patterns to be included in the first photomask and at least one second pattern to be included in the second photomask. A selected one of the first patterns has first and second endpoints, to be replaced by a replacement pattern connecting the first endpoint to a third endpoint. At least one respective keep-out region is provided adjacent to each respective remaining first pattern except for the selected first pattern. Data are generated representing the replacement pattern, such that no part of the replacement pattern is formed in any of the keep-out regions. Data representing the remaining first patterns and the replacement pattern are output.

20 Claims, 13 Drawing Sheets

(56) References Cited

U.S. PATENT DOCUMENTS

| | | | |
|---|---|---|---|
| 7,906,253 B2 | 3/2011 | Aton et al. | |
| 8,057,982 B2 | 11/2011 | Hatakeyama et al. | |
| 8,234,599 B2 * | 7/2012 | Sahouria et al. | 716/55 |
| 8,239,806 B2 | 8/2012 | Chen et al. | |
| 8,247,166 B2 | 8/2012 | Takemura et al. | |
| 8,327,301 B2 * | 12/2012 | Cheng et al. | 716/55 |
| 8,347,240 B2 * | 1/2013 | Agarwal et al. | 716/54 |
| 8,375,348 B1 * | 2/2013 | Raj et al. | 716/126 |
| 8,418,111 B2 * | 4/2013 | Chen et al. | 716/126 |
| 8,434,043 B1 * | 4/2013 | Hsu et al. | 716/113 |
| 8,468,470 B2 * | 6/2013 | Hsu et al. | 716/54 |
| 8,473,873 B2 * | 6/2013 | Hsu et al. | 716/51 |
| 8,473,874 B1 * | 6/2013 | Sharma et al. | 716/52 |
| 8,560,998 B1 * | 10/2013 | Salowe et al. | 716/126 |
| 8,572,521 B2 * | 10/2013 | Chen et al. | 716/54 |
| 8,601,408 B2 * | 12/2013 | Chen et al. | 716/55 |
| 8,601,409 B1 * | 12/2013 | Chen et al. | 716/55 |
| 8,645,877 B2 * | 2/2014 | Hsu et al. | 716/52 |
| 8,671,368 B1 * | 3/2014 | Salowe et al. | 716/55 |
| 8,683,392 B2 * | 3/2014 | Hsieh et al. | 716/52 |
| 8,713,491 B2 * | 4/2014 | Chen et al. | 716/55 |
| 8,726,200 B2 * | 5/2014 | Fu et al. | 716/51 |
| 8,732,626 B2 * | 5/2014 | Liu et al. | 716/50 |
| 8,732,628 B1 * | 5/2014 | Wu et al. | 716/52 |
| 2009/0087619 A1 | 4/2009 | Aton et al. | |
| 2010/0176479 A1 | 7/2010 | Postnikov et al. | |
| 2011/0003254 A1 * | 1/2011 | Chang et al. | 430/322 |
| 2011/0004858 A1 | 1/2011 | Chang et al. | |
| 2011/0014786 A1 * | 1/2011 | Sezginer et al. | 438/618 |
| 2011/0023002 A1 | 1/2011 | Cheng et al. | |
| 2011/0119648 A1 | 5/2011 | Chen et al. | |
| 2011/0191728 A1 | 8/2011 | Yang et al. | |
| 2011/0193234 A1 | 8/2011 | Chen et al. | |
| 2012/0131528 A1 * | 5/2012 | Chen et al. | 716/112 |
| 2012/0317524 A1 * | 12/2012 | Taoka | 716/53 |
| 2013/0061186 A1 * | 3/2013 | Hsu et al. | 716/55 |
| 2013/0074028 A1 * | 3/2013 | Blatchford | 716/122 |
| 2013/0091476 A1 * | 4/2013 | Chen et al. | 716/55 |
| 2013/0254726 A1 * | 9/2013 | Hsu et al. | 716/53 |
| 2014/0007026 A1 * | 1/2014 | Chen et al. | 716/55 |
| 2014/0059504 A1 * | 2/2014 | Chen et al. | 716/55 |

OTHER PUBLICATIONS

Kruif R., et al, "Wafer Based Mask Characterization for Double Patterning Lithography", 24th European Mask and Lithography Conference, pp. 71-82, Jan. 2008.

Bubke, K. et al., "Mask Characterization for Double Patterning Lithography", Journal of Micro/Nanolithography, MEMS and MOEMS, 10 pages, Jan. 2009.

Mitra et al., "RADAR: RET-Aware Detailed Routing Using Fast Lithography Simulations", Proceedings of the 42nd Design Automation Conference, pp. 369-372, Jun. 2005.

Khang et al., "Layout Decomposition Approaches for Double Patterning Lithography", IEEE Transactions on Computer-Aided Design of Integrated Circuits and Systems, 2010, 29(6):939-952.

Yuan et al, "Double Patterning Layout Decomposition for Simultaneous Conflict and Stitch Minimization", IEEE Transactions on Computer-Aided Design of Integrated Circuits and Systems, 2010, 29(2):185-196.

* cited by examiner

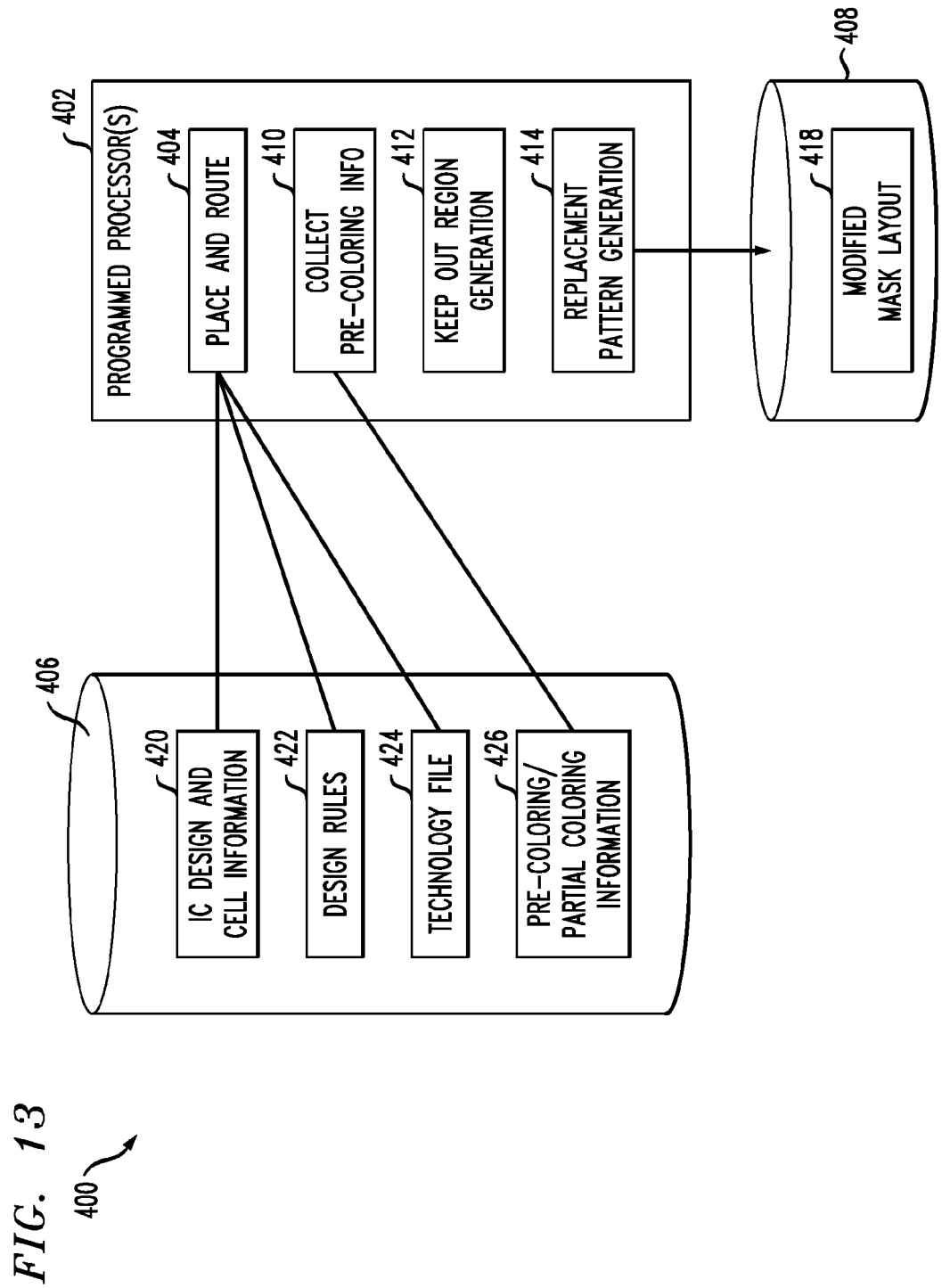

METHOD AND SYSTEM FOR REPLACING A PATTERN IN A LAYOUT

This application is a division of U.S. patent application Ser. No. 13/269,757, filed Oct. 10, 2011, which is expressly incorporated by reference herein in its entirety.

FIELD

The present disclosure relates to semiconductor fabrication generally and more specifically to multi-patterning, such as double patterning.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Double exposure involves forming patterns on a single layer of a substrate using two different masks in succession. As a result, a minimum line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. The layout polygon and critical space are similar to the vertex and edge of the graph respectively. Two adjacent vertices connected with an edge should be assigned different colors. If only two masks are to be used, then only two "color types" are assigned. Each pattern on the layer is assigned a first or second "color"; the patterns of the first color are formed by a first mask, and the patterns of the second color are formed by a second mask. A graph is 2-colorable only if it contains no odd loop.

In terms of graph theory, when the total number of relationships between patterns that violate the minimum threshold spacing for a single mask (referred to as the separator distance) is odd, an odd loop is present, and DPT cannot be used without changing the layout.

In some cases, after a layout has proceeded through double patterning decomposition, and photomasks are produced, the designer discovers an underlying logic error in the design, which must be corrected through a design change (e.g., an engineering change order). Such a design change may require new photomasks, at added expense. Because two masks are used for a single layer, the added expense is doubled.

BRIEF DESCRIPTION OF THE DRAWINGS

FIG. 13 is a block diagram of the system.

DETAILED DESCRIPTION

Figure 1:
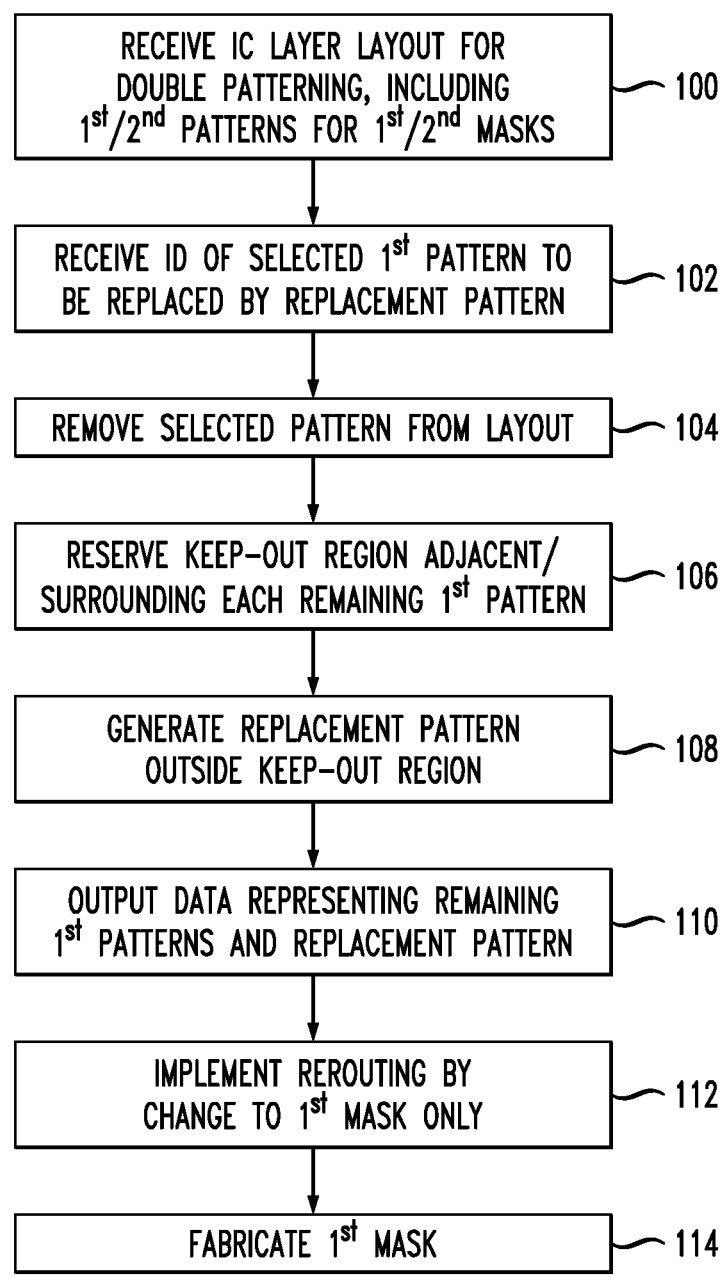
FIG. 1 is a flow chart of a first embodiment of the method.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

To minimize the added expense of implementing a design change after double-patterning decomposition (especially after photomask fabrication), it is desirable to minimize the number of masks that are changed to implement the design change. If the double patterning decomposition tool is given complete freedom to implement the modified design, the tool may make changes to both (or all) photomasks for the modified layer, increasing expense.

In some embodiments, one available technique is to keep all of the patterns fixed, except for the selected pattern that is to be removed, and construct "keep-out" regions adjacent to (or surrounding) all the other patterns. The replacement pattern is not permitted to intersect any of the keep-out regions. By only routing the replacement pattern outside of the keep-out regions, the system can ensure that the minimum separator distance between two patterns formed by the same photomask is maintained. The replacement pattern routing is constrained so as not to intersect any of the other patterns, or any of the keep-out regions. This technique limits the change to a single mask—the mask containing the replacement pattern. However, if every pattern is surrounded by a keep-out region, the layout may become so filled with keep-out regions that it becomes impossible to reroute the selected pattern while avoiding all of the keep-out regions.

The inventors have determined that improved re-routing is achieved if no keep-out regions are constructed adjacent to patterns that are known to be formed on a different photomask from the selected pattern that is to be replaced. This method may be used in two different situations.

In the first situation, referred to herein as "pre-coloring", the user (e.g., designer or foundry engineer) knows on which photomask each pattern in the layer is formed, including the selected pattern to be replaced and its replacement pattern. In other words, the user knows the color of every pattern. In this case, keep-out regions are only constructed adjacent to patterns that are known to be formed on the same photomask as the selected pattern that is to be replaced. The replacement pattern is rerouted so as to not intersect any of the keep-out regions or the patterns on the other mask.

In the second situation, referred to herein as "partial-coloring", the user does not know on which photomask each pattern in the layer is formed. For example, the user may be a design house engineer, and the foundry may only give the user partial information in order to keep certain processes and software as trade secret information. The user is only given a subset of the patterns that are formed on the same photomask as the selected pattern, and a subset of the patterns that are formed on a different photomask from the selected pattern. The user is given no color information with respect to the remaining patterns, which may be on either mask. Although the user has no color information about the remaining patterns, the remaining patterns have been assigned to particular masks. These assignments, even though unknown to the user, constrain the routing of the replacement pattern. In this case, "keep-out" regions are only constructed adjacent to patterns that are known to be formed on the same photomask as the selected pattern that is to be replaced, and adjacent to patterns for which the mask assignment is unknown. The replacement pattern is rerouted so as to not intersect any of the keep-out regions or the patterns known to be assigned to a different mask than the selected pattern.

FIG. 1 is a flow chart of the first embodiment. FIGS. 2-6 show an example of the application of a method to a layer of an integrated circuit.

At step 100 of FIG. 1, a layout is received identifying a plurality of circuit components to be included in an integrated circuit (IC) layer for double patterning the layer using first and second photomasks. For example, the layer 200 (FIG. 2) may be a copper metal layer of the interconnect structure of an IC, to be formed by a dual damascene process. The layout 200 includes a plurality of first patterns 220, 230, 231 to be included in the first photomask and at least one second pattern 240, 241, 242, 243 to be included in the second photomask. In the example, a cell 210, is also provided from an IP library of pre-existing cell designs. The layout data may be received from a machine readable storage medium of a computer system of a foundry or a designer. The data are received by an automated system (described below with reference to FIG. 13) for rerouting one of the patterns.

At step 102 of FIG. 1, the system receives an identification of a selected one of the first patterns 220 having a first endpoint 221 and a second endpoint 222. The selected pattern 220 is to be replaced by a replacement pattern 260 (FIG. 6) connecting the first endpoint 221 to a third endpoint 223. For example, the user may have determined that a design change is appropriate to change the circuit connected to the cell 210. The user may identify the selected pattern 220 by using a pointing device coupled to a computer that graphically displays all the patterns of the layer. In other embodiments, the user may select a text entry from a netlist defining the layout.

Figure 3:
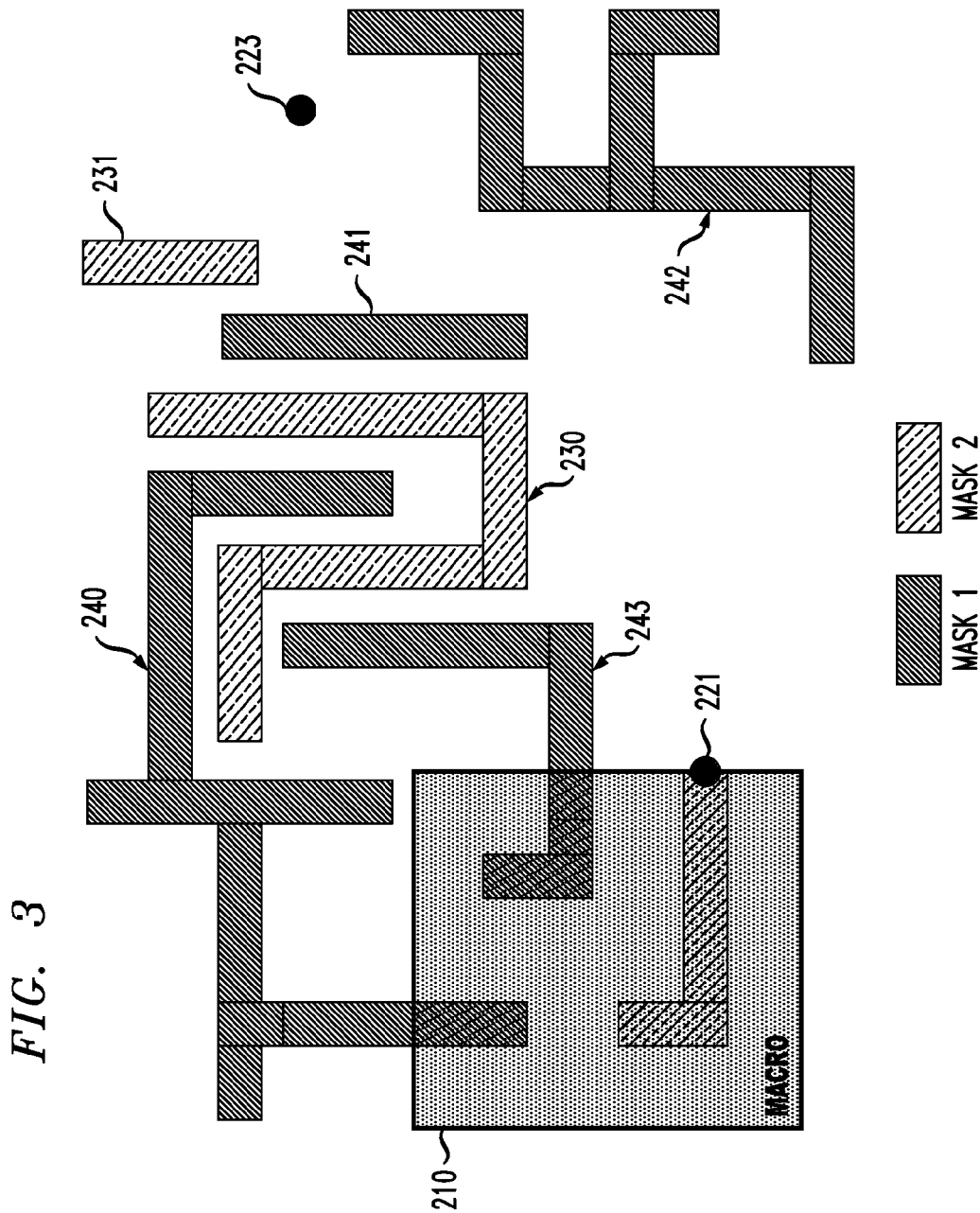
FIG. 3 shows the layout of FIG. 2, with the selected pattern removed.

At step 104 of FIG. 1, the system removes the selected pattern 220 from the layout 200. FIG. 3 is a schematic view of the layout 200 at this stage. The IP cell 210 now has an unconnected pin 221. In some embodiments, the system displays this intermediate stage to the user during the process.

At step 106 of FIG. 1, the system reserves at least one respective keep-out region 250 (FIG. 4). adjacent to each respective remaining first pattern 230 except for the selected first pattern 220 (which has already been removed). In some embodiments, each respective keep-out region 250 surrounds its corresponding first pattern 230 on all sides thereof. For example, in some embodiments, the keep-out region dimensions are determined by multiplying each dimension of the pattern to be surrounded by a constant. In another embodiment, the pattern 230 is decomposed into individual rectangles, and a keep-out region 250a-250c is constructed around each of the individual components of the pattern 230. By constructing individual keep-out region portions 250a-250c for each component of a complex pattern 230, the overall size of the keep-out region 250 is minimized. This type of keep-out region can be implemented through the technology file of the electronic design automation (EDA) tool, to selectively increase the size of the individual rectangles making up pattern 230.

In some embodiments, pattern 231 is a rectangle, and a respective keep-out region 251 around that rectangle has a perimeter, such that the perimeter has a first distance d1 from a longer side of the rectangle 251, and the perimeter has a second distance d2 from a shorter side of the rectangle. Other techniques may be used to construct the keep-out region.

Figure 4:
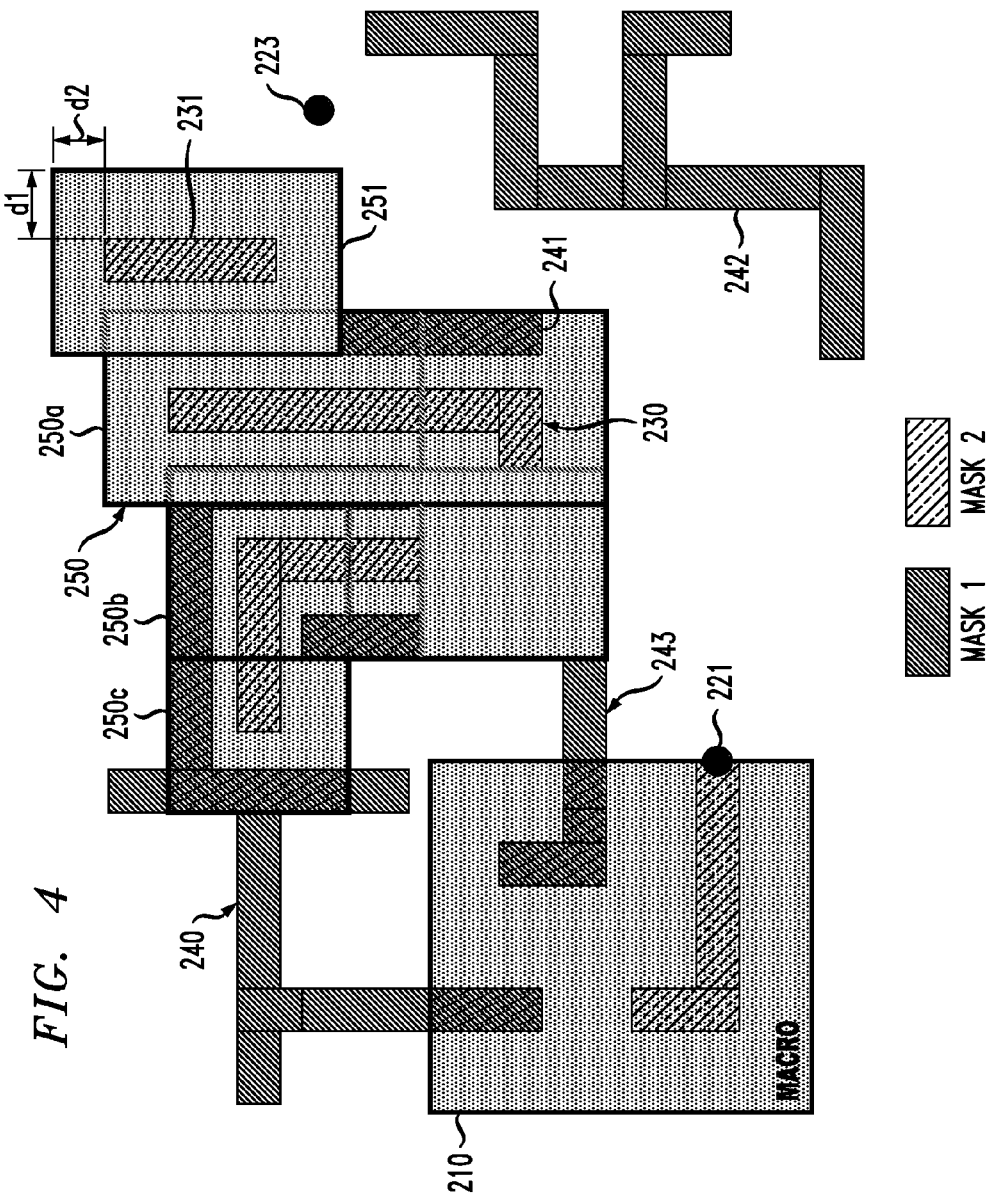
FIG. 4 shows the layout of FIG. 3, with keep-out regions added.
Figure 5:
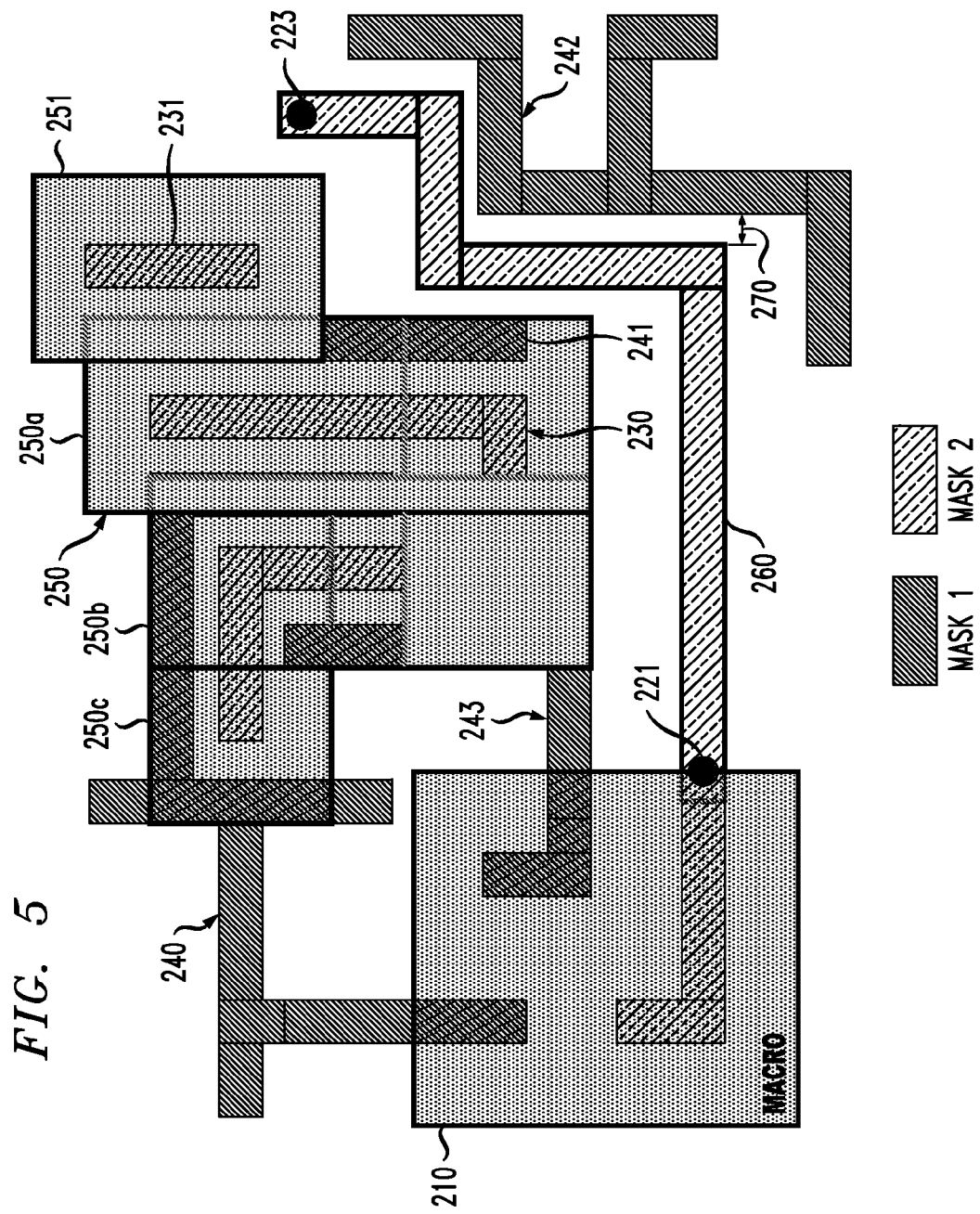
FIG. 5 shows the layout of FIG. 4 with the replacement pattern added.

In the example of FIG. 4, patterns 240, 241, 242 and 243 are known to be assigned to the second mask, which is different from the first mask having the selected pattern 220. Thus, no keep-out regions are constructed adjacent to patterns 240-243.

At step 108 of FIG. 1, the system generates data representing the replacement pattern 260 (FIG. 5), such that no part of the replacement pattern 260 is formed in any of the keep-out regions 250. Because patterns 240-243 are formed on another mask, there is no need to maintain the minimum separation distance between the replacement pattern and patterns 240-243 (so long as the replacement pattern does not intersect second patterns 240-243). Thus, the distance 270 between the replacement pattern 260 on the first photomask and pattern 242 on the second mask can be less than the minimum separator distance for two lines on the same photomask.

Figure 6:
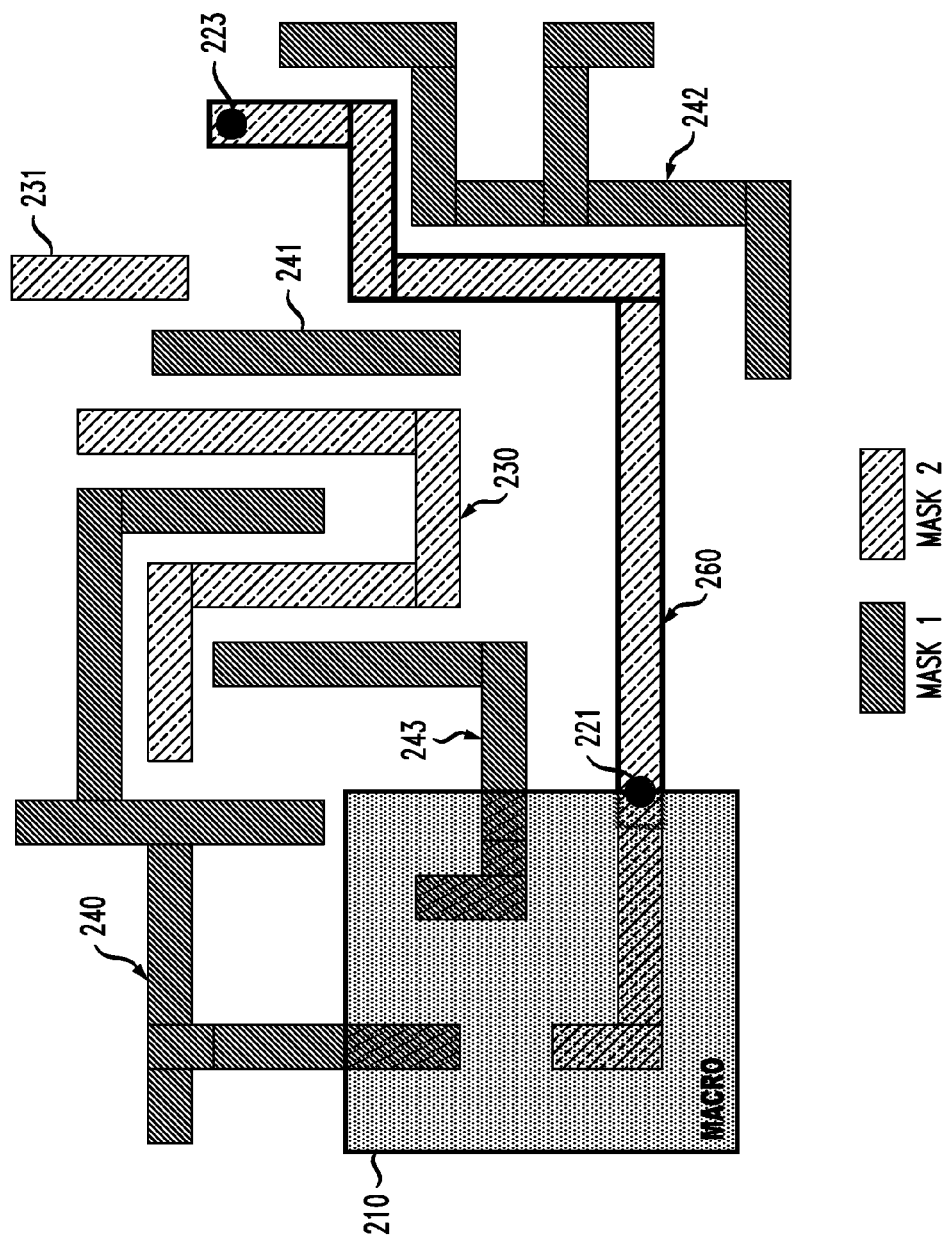
FIG. 6 shows the final layout, with the replacement pattern added.

At step 110 of FIG. 1, the system outputs data representing the remaining first patterns 230, 231 and the replacement pattern 260 to a machine readable storage medium to be read to fabricate the first photomask. The data representing the remaining first patterns and the replacement pattern form a double patterning compliant set of photomask layouts without rerouting any of the at least one second patterns. In some embodiments, the data are output in a GDS II format, compatible with the output of the EDA tool. In other embodiments, the data are output in a proprietary format. Optionally, the system may provide a graphical output of the layout to the user, as shown in FIG. 6.

At step 112, the rerouting is implemented by a change to the first mask only, without affecting the second mask. In the example shown in FIG. 6, the patterns 241 and 242 are so close together, that the router might be unable to generate a pattern connecting the endpoints 221 and 223 if keep-out regions were reserved around the patterns 241 and 242. By omitting the keep-out regions around patterns that are known to be assigned to the second photomask, the system provides enough flexibility for the router to quickly find the pattern 260.

At step 114, the first mask is fabricated. If the second mask has previously been fabricated, there is no need to replace the second photomask.

Although the first example describes an embodiment with only two photomasks, the method can be extended to ICs in which three or more masks are used to pattern one layer. In step 106, the system only reserves keep-out regions for the same mask in which the selected pattern is formed. No keep-out regions are reserved in any of the other masks. At step 108, the replacement pattern is rerouted to avoid intersecting any of the keep-out regions and to avoid intersecting any of the patterns on any of the photomasks.

Figure 7:
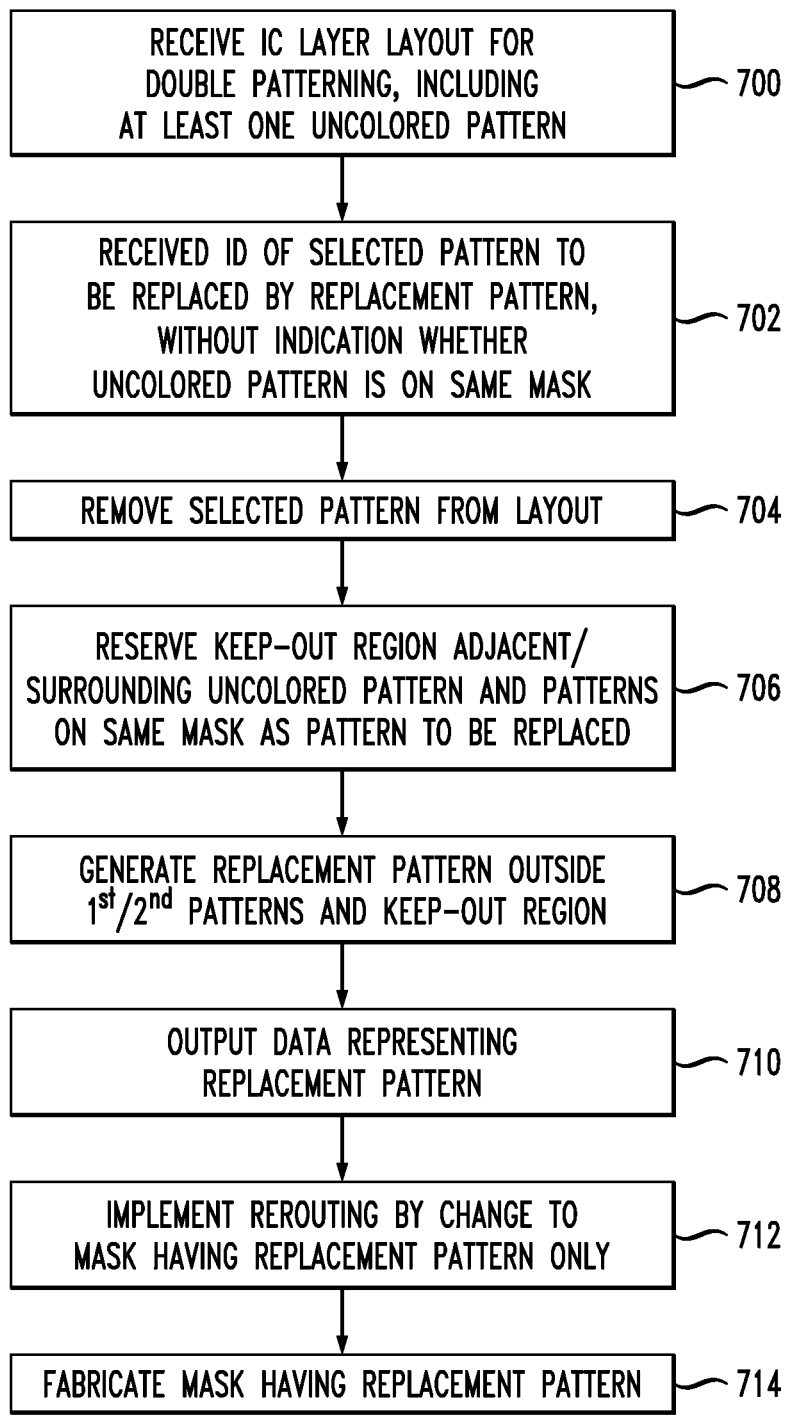
FIG. 7 is a flow chart of a first embodiment of the method.

FIG. 7 is a flow chart of a variation of the method, in which the user has only partial knowledge regarding the assignment of the patterns to the two photomasks (partial coloring).

Figure 8:
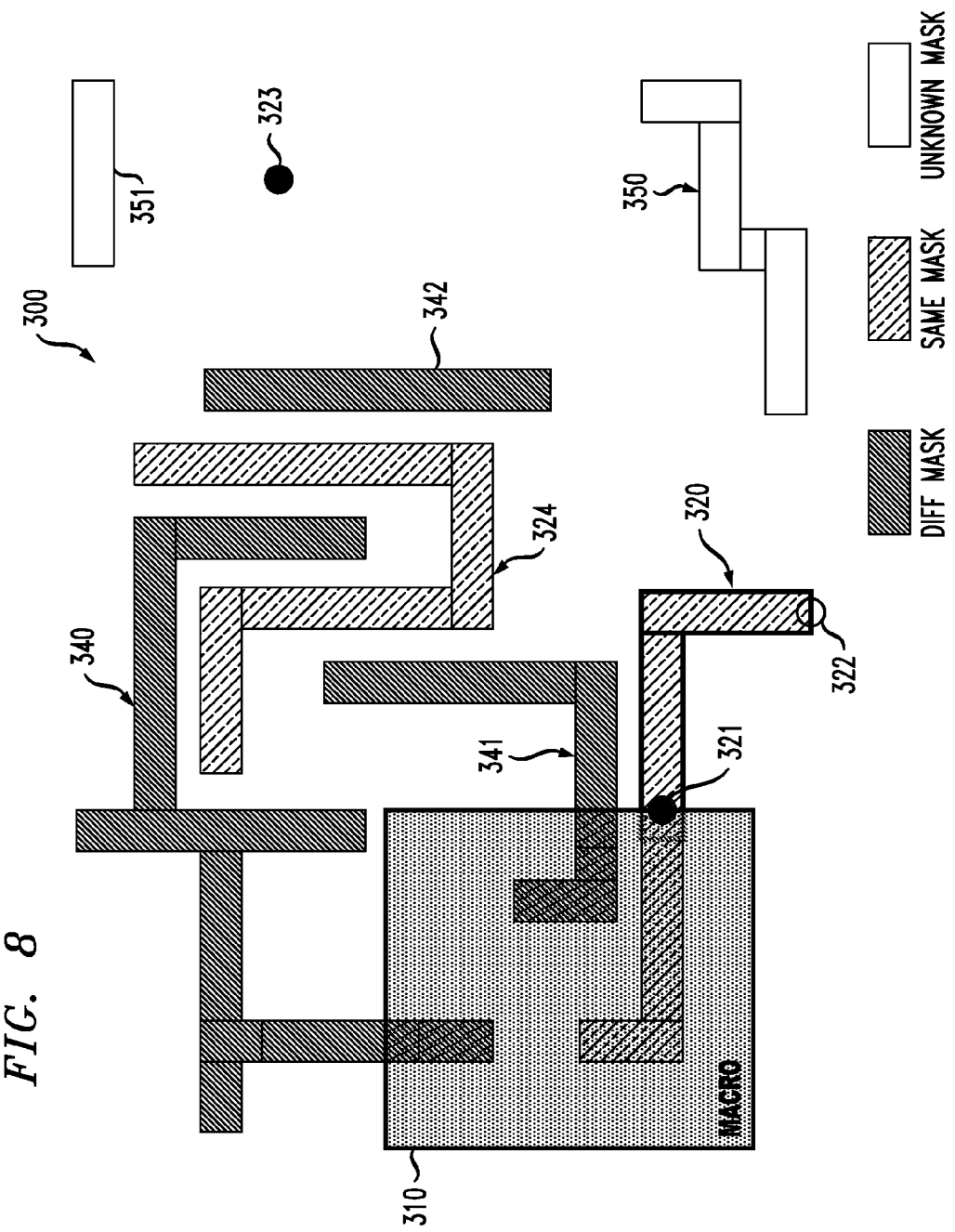
FIG. 8 is a diagram of a partially-colored layout having a selected pattern to be replaced.

At step 700 of FIG. 7, the system receives an integrated circuit (IC) layout 300 (FIG. 8) for double patterning a layer of the IC using first and second photomasks. The layout 300 includes a plurality of circuit patterns, at least one of which is an uncolored pattern. For example, the user may be a designer, who informs a foundry that he needs to reroute the pattern 320 connected to the cell 310, and the user's system receives a partially colored layout. In FIG. 8, the user's system receives information indicating that pattern 324 is on the same mask as pattern 320, and patterns 340, 341 and 342 are on a different mask. The user's system is aware that patterns 350 and 351 are to be fabricated on the same metal layer of the IC, but has no knowledge as to whether or not patterns 350 and 351 are formed by the same mask as patterns 320 and 324.

At step 702 of FIG. 7, the user's system receives an identification of a selected one of the plurality of circuit patterns 320 having first endpoint 321 and a second endpoint 322, to be replaced by a replacement pattern connecting the first endpoint 321 to a third endpoint 323, without receiving an indication in steps 700 or 702 of whether the uncolored patterns 350, 351 are to be included in the first photomask or the second photomask. For example, the user may input the identification by selecting the pattern 320 using a graphical user interface, or the user may input the information by text information, using a netlist format.

Figure 9:
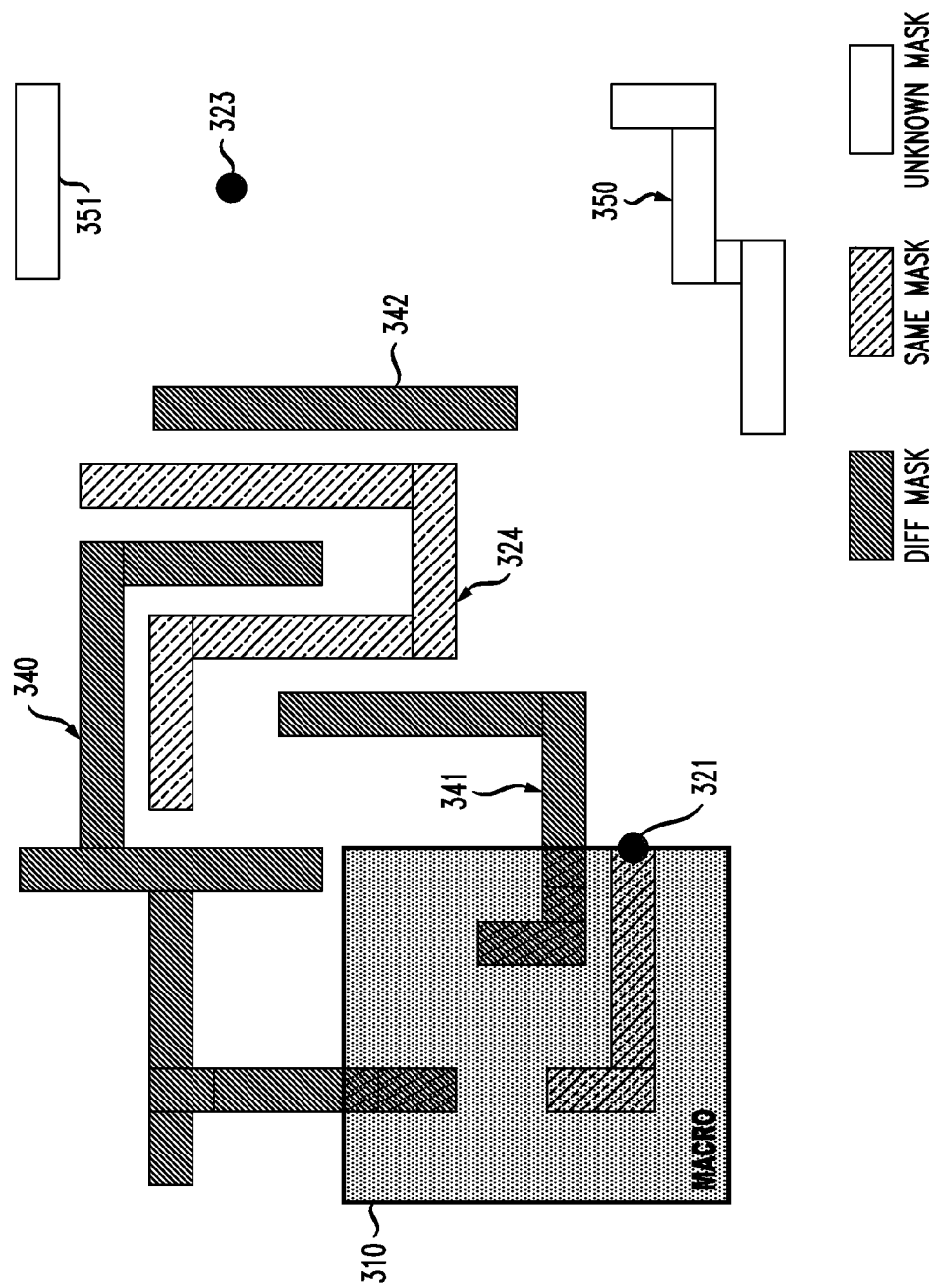
FIG. 9 shows the layout of FIG. 8, with the selected pattern removed.

At step 704 of FIG. 7, the system removes the selected pattern 320 from the layout. The result is shown in FIG. 9.

Figure 10:
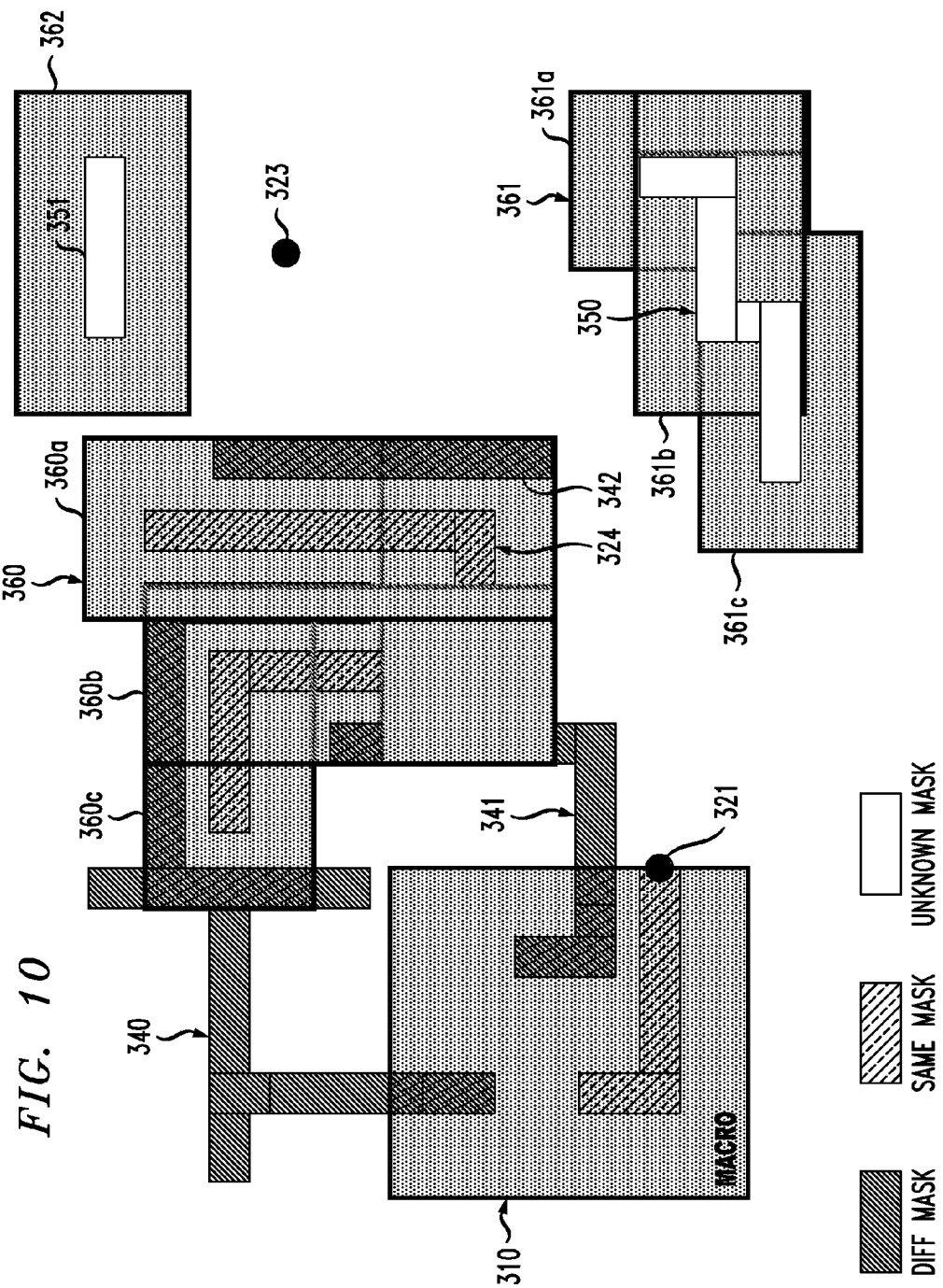
FIG. 10 shows the layout of FIG. 9, with keep-out regions added.

At step 706 of FIG. 7, the system reserves at least one keep-out region 361, 362 adjacent to the at least one uncolored pattern 350, 351, respectively. Because the color information for these patterns is not available, they are treated as though they are on the same photomask as the selected pattern 320. The system also reserves at least one keep-out region 360 adjacent to the region(s) 324 identified as being in the same mask as the selected pattern 320. No keep-out regions are reserved for the regions 340, 341 and 342, which are identified as being on a different photomask from the selected pattern. The resulting layout is shown in FIG. 10.

In some multi-patterning embodiments, where more than two photomasks are used, all patterns identified as being on a different photomask from the selected pattern 320 are treated identically to each other. No keep-out regions are reserved for any pattern assigned to any of the photomasks other than the photomask on which the selected pattern 320 is provided.

Figure 11:
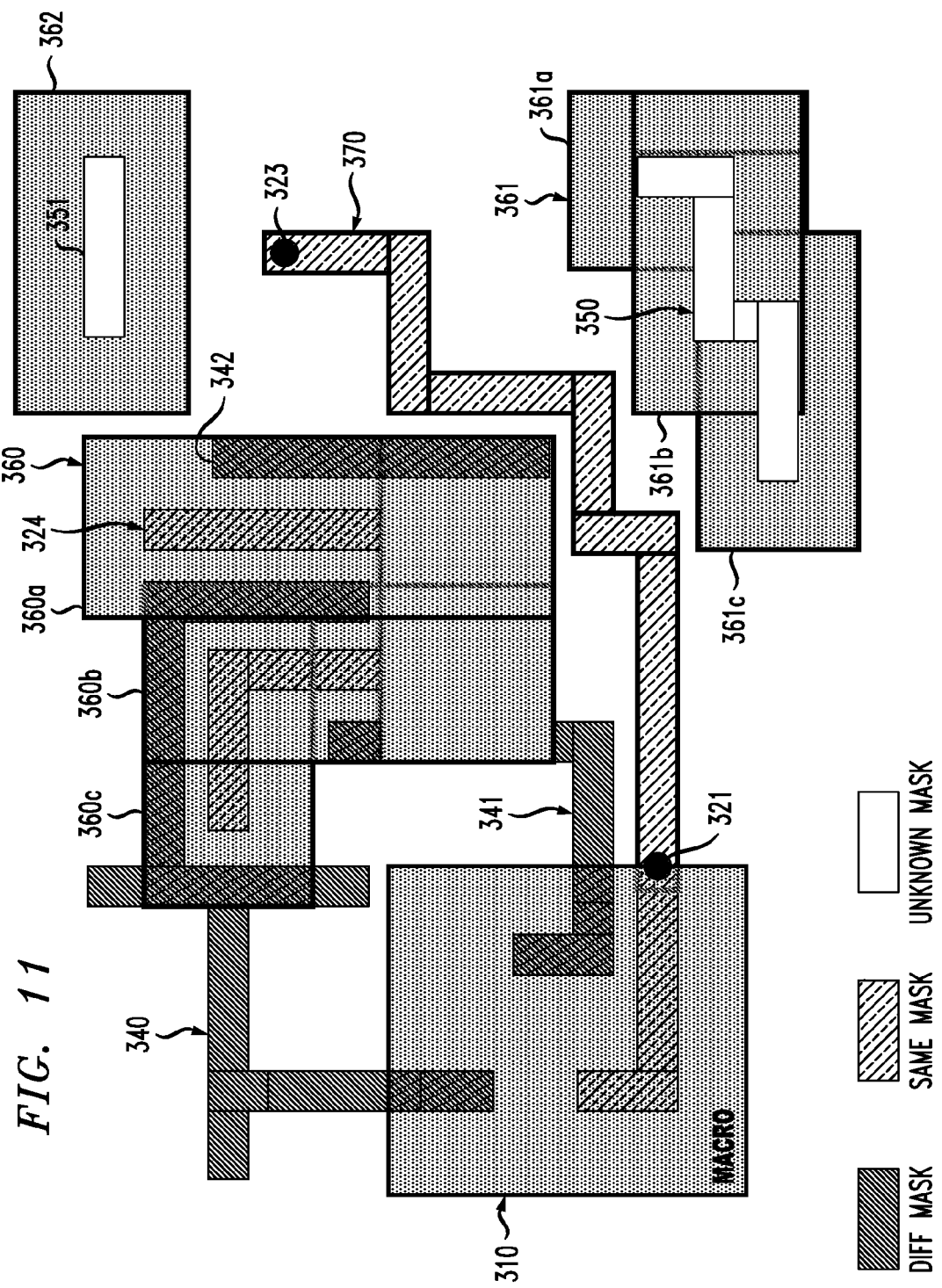
FIG. 11 shows the layout of FIG. 10 with the replacement pattern added.

At step 708 of FIG. 7, the system generates data representing the replacement pattern 370, such that no part of the replacement pattern 370 intersects any of the plurality of circuit patterns 340-342 or any of the keep-out regions 360, 361, 362. The result is shown in FIG. 11. Because no keep-out region is reserved for the patterns 340-342, the router can route the replacement pattern 370, so that a distance between pattern 370 and one or more of the patterns 340-342 is closer than the minimum separator distance for patterns to be formed on the same photomask as each other.

At step 710 of FIG. 7, the system outputs data representing the replacement pattern, to be combined with data representing ones of the plurality of circuit patterns to be formed on the same photomask as the replacement pattern, on a machine readable storage medium to be read to fabricate the same photomask.

Figure 12:
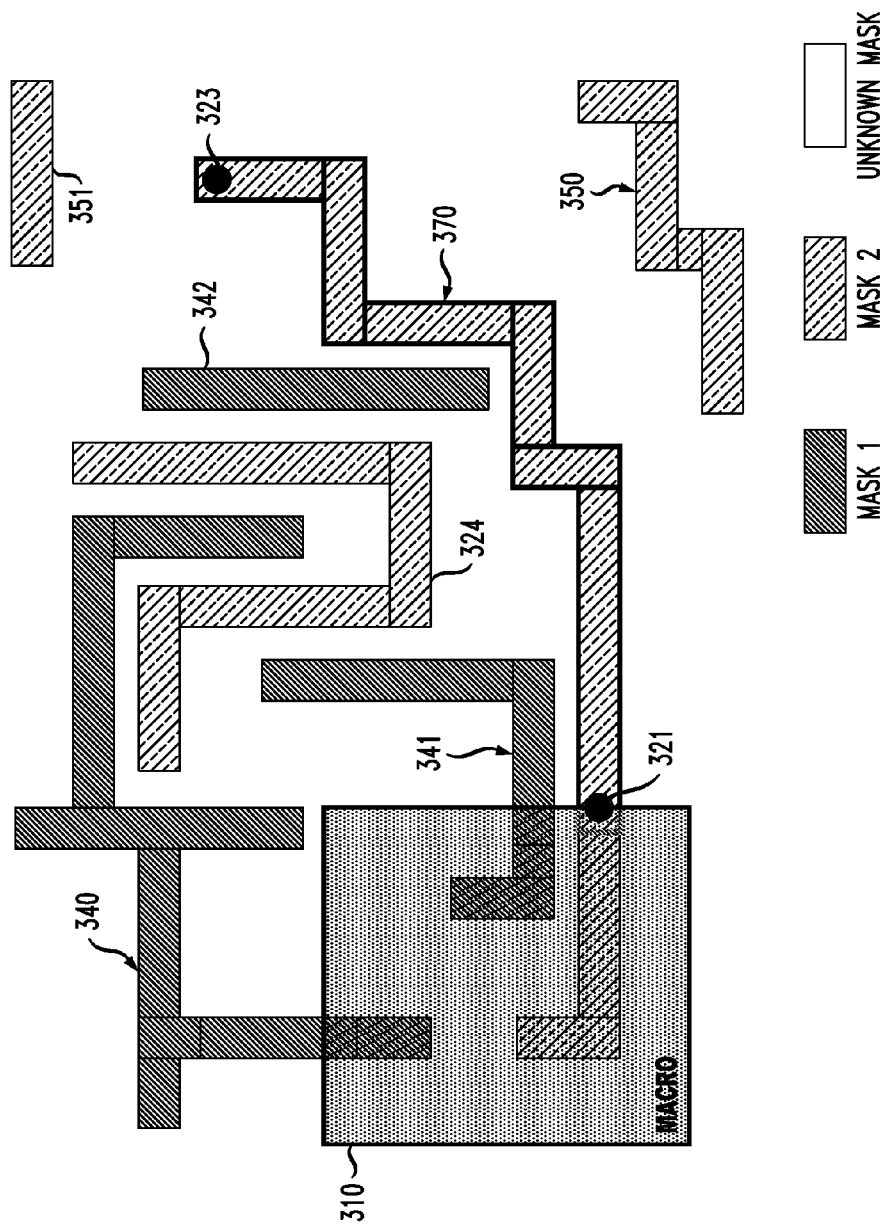
FIG. 12 shows the final layout, with the replacement pattern added.

At step 712 of FIG. 7, the rerouting has been implemented to replace the selected pattern 320 with the replacement pattern 370 in the same photomask, so as to form a complete set of layouts for double patterning the layer with a change to only the same photomask, without changing a layout of the other of the first and second photomasks. The result is shown in FIG. 12. Note that the user is unaware that patterns 350 and 351 are actually formed on the same mask as the replacement pattern 370. By reserving the keep-out regions adjacent the uncolored patterns, the system ensures that the layer can be patterned regardless of whether the uncolored patterns 350 and 351 are formed on the same photomask as the replacement pattern.

Although the second example describes an embodiment with only two photomasks, the method can be extended to ICs in which three or more masks are used to pattern one layer. In step 706, the system reserves keep-out regions around patterns in the same mask in which the selected pattern is formed and around all uncolored patterns. No keep-out regions are reserved for any patterns identified as being in a different mask from the selected pattern. At step 708, the replacement pattern is rerouted to avoid intersecting any of the keep-out regions and to avoid intersecting any of the patterns on any of the photomasks.

At step 714 of FIG. 7, the system forms the first photomask containing the replacement pattern 370 and the patterns 324, 350 and 351. Thus the re-routing has been accomplished with a change to only one mask.

FIG. 13 is a block diagram of a system 400 for rerouting a selected pattern 220, according to one embodiment. Block 402 indicates that one or more programmed processors may be included. In some embodiments, the processing load is performed by two or more application programs, each operating on a separate processor. In other embodiments, the processes are all performed using one processor. Similarly, two media 406 and 408 are shown, but the data may be stored in any number of media. Although FIG. 13 shows an allocation of the various tasks to specific modules, this is only one example. The various tasks may be assigned to different modules to improve performance, or improve the ease of programming.

System 400 includes an electronic design automation ("EDA") tool 402 such as "IC COMPILER"™, sold by Synopsys, Inc. of Mountain View, Calif., which may include a place and route tool 404, such as "ZROUTE"™, also sold by Synopsys. Other EDA tools 402 may be used, such as the "VIRTUOSO" custom design platform or the Cadence "ENCOUNTER"® digital IC design platform may be used, along with the "VIRTUOSO" chip assembly router 404, all sold by Cadence Design Systems, Inc. of San Jose, Calif.

EDA tool 402 is a special purpose computer formed by retrieving stored program instructions from a non-transient computer readable storage medium 406, 408 and executing the instructions on a general purpose processor (not shown). Examples of non-transient computer readable storage mediums 406, 408 include, but are not limited to, read only memories ("ROMs"), random access memories ("RAMs"), flash memories, hard disk drives, optical disk, or the like. Tangible, non-transient machine readable storage mediums 406, 408 are configured to store data generated by the place and route tool 404.

Place and route tool 404 is capable of receiving an identification of a plurality of cells to be included in an integrated circuit ("IC") or interposer layout. The place and route tool 404 places the cells from the IP library and lays out the connecting patterns to connect the input/output pins of the cells. The place and route tool 404 may be equipped with a set of default design rules 422 and technology file 424.

Figure 2:
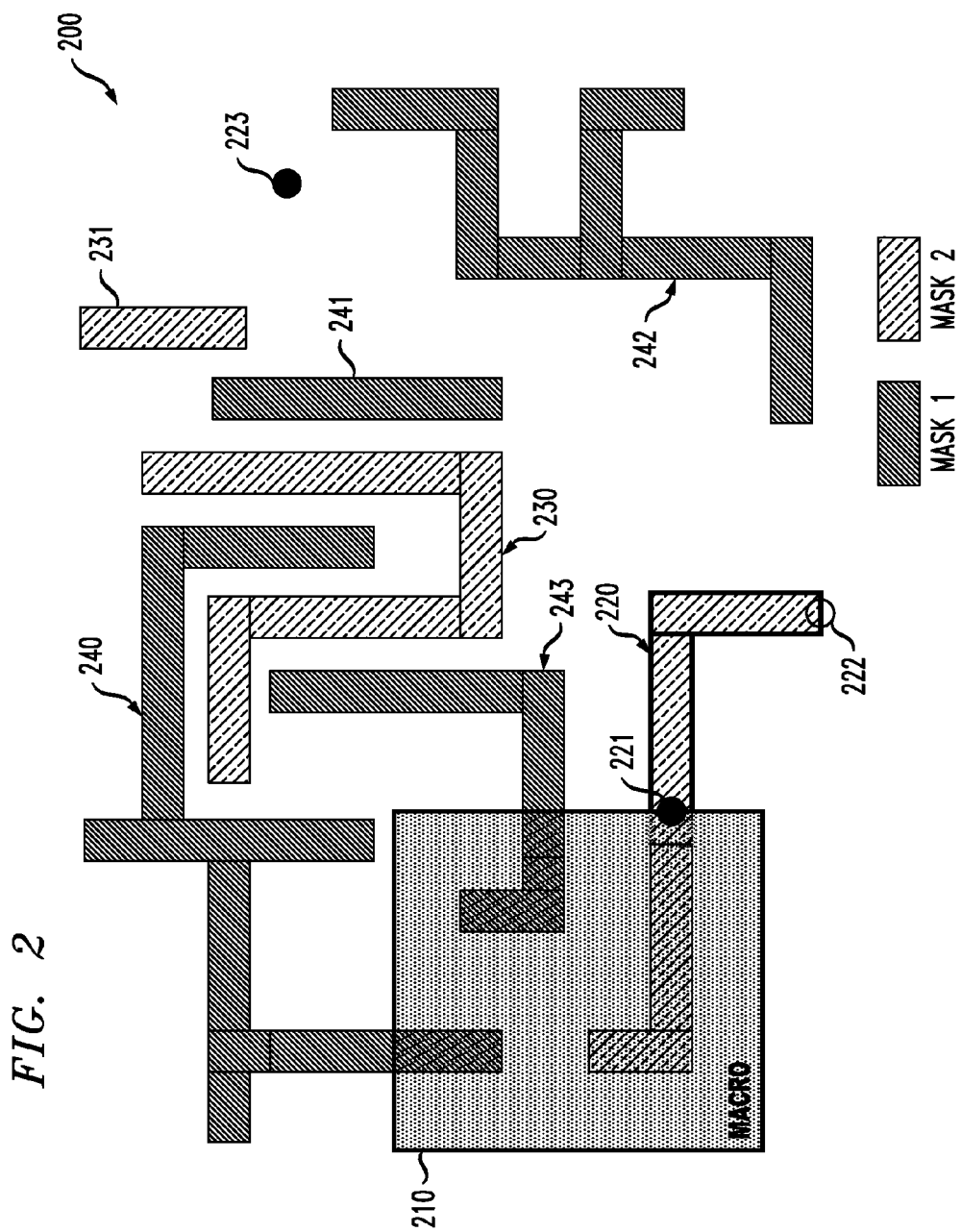
FIG. 2 is a diagram of a pre-colored layout having a selected pattern to be replaced.

The "collect pre-coloring information" module 410 provides the user tools for selecting one or more patterns to be replaced. In some embodiments, module 410 display the layout of a metal layer with the available color information, as shown in FIG. 2 or FIG. 8. The module receives the user's selection of the pattern(s) to be replaced, and requests/retrieves the available coloring information, which may be complete pre-coloring information (assignments of all patterns) or partial coloring information (subset of patters on same mask as selected pattern, a subset of patterns on different masks, and the remaining uncolored patterns).

The keep-out region generation module 412 constructs the appropriate keep-out regions for all patterns (if any) known to be on the same photomask as the selected pattern, and for all patterns (if any) for which color information is not available to the system.

The replacement pattern generation module 414 determines the replacement pattern 260, so as to avoid intersection with any of the keep-out regions and avoid intersection with any of the patterns.

In some embodiments, a routing method comprises: (a) receiving a layout identifying a plurality of circuit components to be included in an integrated circuit (IC) layer for double patterning the layer using first and second photomasks, the layout including a plurality of first patterns to be included in the first photomask and at least one second pattern to be included in the second photomask; (b) receiving an identification of a selected one of the first patterns having first and second endpoints, to be replaced by a replacement pattern connecting the first endpoint to a third endpoint; (c) reserving at least one respective keep-out region adjacent to each respective remaining first pattern except for the selected first pattern; (d) generating data representing the replacement pattern, such that no part of the replacement pattern is formed in any of the keep-out regions; and (e) outputting data representing the remaining first patterns and the replacement pattern to a machine readable storage medium to be read to fabricate the first photomask.

In some embodiments, a routing method comprises: (a) receiving an integrated circuit (IC) layout for double patterning a layer of the IC using first and second photomasks, the layout including a plurality of circuit patterns, at least one of which is an uncolored pattern; (b) receiving an identification of a selected one of the plurality of circuit patterns having first and second endpoints, to be replaced by a replacement pattern connecting the first endpoint to a third endpoint, without receiving an indication in step (a) or (b) of whether the uncolored pattern is to be included in the first photomask or the second photomask; (c) removing the selected pattern from the layout; (d) reserving at least one keep-out region adjacent to the at least one uncolored pattern; (e) generating data representing the replacement pattern, such that no part of the replacement pattern intersects any of the plurality of circuit patterns or the at least one keep-out region; and (f) outputting data representing the replacement pattern, to be combined with data representing ones of the plurality of circuit patterns to be formed on the same photomask as the replacement pattern, on a machine readable storage medium to be read to fabricate the same photomask.

In some embodiments, a persistent machine readable storage medium is encoded with computer program code, such that when the computer program code is executed by a processor, the processor performs a method comprising: (a) receiving an identification of a plurality of circuit components to be included in an integrated circuit (IC) layout for double patterning a layer using first and second photomasks, the identification including a plurality of first patterns to be included in the first photomask and at least one second pattern to be included in the second photomask; (b) receiving an identification of a selected one of the first patterns having first and second endpoints, to be replaced by a replacement pattern connecting the first endpoint to a third endpoint; (c) reserving at least one respective keep-out region adjacent to each respective remaining first pattern except for the selected first pattern; (d) generating data representing the replacement pattern, such that no part of the replacement pattern is formed in any of the keep-out regions; and (e) outputting data representing the remaining first patterns and the replacement pattern to a machine readable storage medium to be read to fabricate the first photomask.

In some embodiments, a persistent machine readable storage medium is encoded with computer program code, such that when the computer program code is executed by a processor, the processor performs a method comprising: (a) receiving an integrated circuit (IC) layout for double patterning a layer of the IC using first and second photomasks, the layout including a plurality of circuit patterns, at least one of which is an uncolored pattern; (b) receiving an identification of a selected one of the plurality of circuit patterns having first and second endpoints, to be replaced by a replacement pattern connecting the first endpoint to a third endpoint, without receiving an indication in step (a) or (b) of whether the uncolored pattern is to be included in the first photomask or the second photomask; (c) removing the selected pattern from the layout; (d) reserving at least one keep-out region adjacent to the at least one uncolored pattern; (e) generating data representing the replacement pattern, such that no part of the replacement pattern intersects any of the plurality of circuit patterns or the at least one keep-out region; and (f) outputting data representing the replacement pattern, to be combined with data representing ones of the plurality of circuit patterns to be formed on the same photomask as the replacement pattern, on a machine readable storage medium to be read to fabricate the same photomask.

In some embodiments, a system comprises: a programmed processor coupled to at least one persistent, machine readable storage medium. The medium has a first storage portion storing data representing a layout identifying a plurality of circuit components to be included in an integrated circuit (IC) layer for double patterning the layer using first and second photomasks, the layout including a plurality of first patterns to be included in the first photomask and at least one second pattern to be included in the second photomask. The at least one medium has a second storage portion for storing an identification of a selected one of the first patterns having first and second endpoints, to be replaced by a replacement pattern connecting the first endpoint to a third endpoint. The processor is configured for: (a) reserving at least one respective keep-out region adjacent to each respective remaining first pattern except for the selected first pattern; (b) generating data representing the replacement pattern, such that no part of the replacement pattern is formed in any of the keep-out regions; and (c) outputting data representing the remaining first patterns and the replacement pattern to a machine readable storage medium to be read to fabricate the first photomask.

In some embodiments, a system comprises: a programmed processor coupled to at least one persistent, machine readable storage medium. The medium has a first storage portion storing data representing an integrated circuit (IC) layout for double patterning a layer of the IC using first and second photomasks, the layout including a plurality of circuit patterns, at least one of which is an uncolored pattern. The at least one medium has a second storage portion for receiving an identification of a selected one of the plurality of circuit patterns having first and second endpoints, to be replaced by a replacement pattern connecting the first endpoint to a third endpoint, without receiving an indication of whether the uncolored pattern is to be included in the first photomask or the second photomask. The processor is configured for: (a) removing the selected pattern from the layout; (b) reserving at least one keep-out region adjacent to the at least one uncolored pattern; (c) generating data representing the replacement pattern, such that no part of the replacement pattern intersects any of the plurality of circuit patterns or the at least one keep-out region; and (d) outputting data representing the replacement pattern, to be combined with data representing ones of the plurality of circuit patterns to be formed on the same photomask as the replacement pattern, on a machine readable storage medium to be read to fabricate the same photomask.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that the computer becomes a special purpose apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A routing method comprising:
   (a) receiving an integrated circuit (IC) layout for double patterning a layer of the IC using first and second photomasks, the layout including a plurality of circuit patterns, at least one of which is an uncolored pattern;
   (b) receiving an identification of a selected one of the plurality of circuit patterns having first and second endpoints, to be replaced by a replacement pattern connecting the first endpoint to a third endpoint, without receiving an indication in step (a) or (b) of whether the uncolored pattern is to be included in the first photomask or the second photomask, the first endpoint being connected to a cell;
   (c) removing the selected pattern from the layout;
   (d) reserving at least one keep-out region adjacent to the at least one uncolored pattern;
   (e) generating data representing the replacement pattern, such that no part of the replacement pattern intersects any of the plurality of circuit patterns or the at least one keep-out region;
   (f) storing the data representing the replacement pattern in a non-transitory machine readable storage medium, to be combined with data representing ones of the plurality of circuit patterns to be formed on the same photomask as the replacement pattern, on a machine readable storage medium to be read to fabricate the same photomask,
   wherein the steps of removing the selected pattern and replacing the selected pattern with the replacement pattern changes a circuit to which the cell is connected.

2. The method of claim 1, wherein:
   steps (e) and (f) implement replacement of the selected pattern by the replacement pattern in the same photomask, so as to form a complete set of layouts for double patterning the layer with a change to only the same photomask, without changing a layout of the other of the first and second photomasks.

3. The method of claim 1, wherein:
   the layout received in step (a) identifies a plurality of first patterns to be formed in the same one of the photomasks as the selected pattern and a plurality of second patterns to be formed in a different one of the photomasks from the selected pattern, the method further comprising:
   reserving at least one additional keep-out region adjacent to each of the first patterns without reserving a keep-out region adjacent to any of the second patterns, and
   step (e) includes generating data representing the replacement pattern, such that no part of the replacement pattern intersects any of the additional keep-out regions.

4. The method of claim 3, wherein:
   the layout received in step (a) identifies a plurality of uncolored patterns;
   the method further comprises reserving at least one further keep-out region adjacent to each respective one of the uncolored patterns; and
   no part of the replacement pattern intersects any of the further keep-out regions.

5. The method of claim 1, wherein:
   the layout received in step (a) identifies a plurality of uncolored patterns;
   the method further comprises reserving at least one further keep-out region adjacent to each respective one of the uncolored patterns; and
   no part of the replacement pattern intersects any of the further keep-out regions.

6. The method of claim 1, further comprising forming the first and second photomasks after step (I).

7. The method of claim 1, wherein the keep-out region surrounds the uncolored pattern on all sides thereof.

8. The method of claim 7, wherein the uncolored pattern includes a plurality of rectangles, and the keep-out region includes a respective individual keep-out region portion around each respective rectangle.

9. The method of claim 7, wherein the uncolored region is a rectangle having a first perimeter, and the keep-out region portion surrounding the uncolored region has a second perimeter located a first distance from a longer side of the rectangle, and the second perimeter has a second distance from a shorter side of the rectangle.

10. The method of claim 1, wherein:
steps (e) and (f) implement replacement of the selected pattern by the replacement pattern in the same photomask as each other, so as to form a complete set of layouts for double patterning the layer by rerouting a portion of the layout corresponding to a single one of the first and second photomasks, without changing a layout of the other of the first and second photomasks.

11. The method of claim 1, wherein:
the keep-out region surrounds the uncolored pattern on all sides thereof;
the layout received in step (a) identifies a plurality of uncolored patterns and a plurality of first patterns to be formed in the same one of the photomasks as the selected pattern and a plurality of second patterns to be formed in a different one of the photomasks from the selected pattern, the method further comprising:
reserving at least one additional keep-out region adjacent to each of the first patterns without reserving a keep-out region adjacent to any of the second patterns, and
reserving at least one further keep-out region adjacent to each respective one of the uncolored patterns;
wherein step (e) includes generating data representing the replacement pattern, such that no part of the replacement pattern intersects any of the additional keep-out regions, and no part of the replacement pattern intersects any of the further keep-out regions,
steps (e) and (f) implement replacement of the selected pattern by the replacement pattern in the same photomask as each other, so as to form a complete set of layouts for double patterning the layer by rerouting a portion of the layout corresponding to a single one of the first and second photomasks, without changing a layout of the other of the first and second photomasks;
the first endpoint is connected to a cell;
the steps of removing the selected pattern and replacing the selected pattern with the replacement pattern changes a circuit to which the cell is connected.

12. The method of claim 1, wherein step (d) does not construct any keep-out region adjacent to any of the plurality of circuit patterns already assigned to be formed on a different photomask from the selected pattern.

13. A non-transitory, machine readable storage medium encoded with computer program code, such that when the computer program code is executed by a processor, the processor performs a routing method comprising:
(a) receiving an integrated circuit (IC) layout for double patterning a layer of the IC using first and second photomasks, the layout including a plurality of circuit patterns, at least one of which is an uncolored pattern, the receiving being performed after fabrication of another photomask for patterning the layer according to the layout;
(b) receiving an identification of a selected one of the plurality of circuit patterns having first and second endpoints, to be replaced by a replacement pattern that is rerouted to connect the first endpoint to a third endpoint, without receiving an indication in step (a) or (b) of whether the uncolored pattern is to be included in the first photomask or the second photomask;
(c) removing the selected pattern from the layout;
(d) reserving at least one keep-out region adjacent to the at least one uncolored pattern;
(e) generating data representing the replacement pattern, such that no part of the replacement pattern intersects any of the plurality of circuit patterns or the at least one keep-out region;
(f) storing the data representing the replacement pattern in a second non-transitory machine readable storage medium, to be combined with data representing ones of the plurality of circuit patterns to be formed on the same photomask as the replacement pattern, on a machine readable storage medium to be read to fabricate the same photomask.

14. The non-transitory, machine readable storage medium of claim 13, wherein:
the layout received in step (a) identifies a plurality of first patterns to be formed in the same one of the photomasks as the selected pattern and a plurality of second patterns to be formed in a different one of the photomasks from the selected pattern, the method further comprising:
reserving at least one additional keep-out region adjacent to each of the first patterns without reserving a keep-out region adjacent to any of the second patterns, and
step (e) includes generating data representing the replacement pattern, such that no part of the replacement pattern intersects any of the additional keep-out regions.

15. The non-transitory, machine readable storage medium of claim 13, wherein:
the layout received in step (a) identifies a plurality of uncolored patterns;
the method further comprises reserving at least one further keep-out region adjacent to each respective one of the uncolored patterns; and
no part of the replacement pattern intersects any of the further keep-out regions.

16. The non-transitory, machine readable storage medium of claim 13, wherein:
the first endpoint is connected to a cell;
the steps of removing the selected pattern and replacing the selected pattern with the replacement pattern changes a circuit to which the cell is connected.

17. The non-transitory, machine readable storage medium of claim 13, wherein:
steps (e) and (f) implement replacement of the selected pattern by the replacement pattern in the same photomask as each other, so as to form a complete set of layouts for double patterning the layer by rerouting a portion of the layout corresponding to a single one of the first and second photomasks, without changing a layout of the other of the first and second photomasks.

18. A system comprising:
non-transitory, machine readable storage medium having data stored therein, representing an integrated circuit (IC) layout for double patterning a layer of the IC using first and second photomasks, the layout including a plurality of circuit patterns, at least one of which is an uncolored pattern; and
a processor configured for:
receiving an identification of a selected one of the plurality of circuit patterns having first and second endpoints, to be replaced by a replacement pattern connecting the first endpoint to a third endpoint, so as to implement a design change, without receiving an indication in step (a) or (b) of whether the uncolored pattern is to be included in the first photomask or the second photomask;
removing the selected pattern from the layout;
reserving at least one keep-out region adjacent to the at least one uncolored pattern;
generating data representing the replacement pattern, such that no part of the replacement pattern intersects any of the plurality of circuit patterns or the at least one keep-out region;

storing data representing the replacement pattern in a second non-transitory machine readable storage medium, to be combined with data representing ones of the plurality of circuit patterns to be formed on the same photomask as the replacement pattern, on the non-transitory, machine readable storage medium to be read to fabricate the same photomask.

19. The system of claim 18, wherein:

the first endpoint is connected to a cell;

the steps of removing the selected pattern and replacing the selected pattern with the replacement pattern changes a circuit to which the cell is connected.

20. The system of claim 18, wherein the processor is configured to perform the generating and outputting so as to implement replacement of the selected pattern by the replacement pattern in the same photomask as each other, so as to form a complete set of layouts for double patterning the layer by rerouting a portion of the layout corresponding to a single one of the first and second photomasks, without changing a layout of the other of the first and second photomasks.

* * * * *